United States Patent
Yamada

(10) Patent No.: US 7,167,378 B2
(45) Date of Patent: Jan. 23, 2007

(54) CIRCUIT BOARD TRANSMITTING HIGH FREQUENCY SIGNAL

(75) Inventor: Shinji Yamada, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 279 days.

(21) Appl. No.: 10/982,524

(22) Filed: Nov. 4, 2004

(65) Prior Publication Data

US 2005/0093642 A1    May 5, 2005

(30) Foreign Application Priority Data

Nov. 5, 2003    (JP)    ............................. 2003-375965

(51) Int. Cl.
*H05K 7/06* (2006.01)
*H04B 3/30* (2006.01)

(52) U.S. Cl. ...................... 361/777; 361/780; 361/782; 361/783; 361/794; 333/12; 333/100; 372/38.1; 372/38.01; 372/38.02; 372/38.08

(58) Field of Classification Search ................ None
See application file for complete search history.

(56) References Cited

U.S. PATENT DOCUMENTS 6,621,385 B1 *    9/2003    Jain ........................... 333/247
6,625,682 B1 *    9/2003    Simon et al. ................ 710/305
7,026,884 B2 *    4/2006    Vogel .......................... 333/116
2001/0050182 A1 *    12/2001    Takeshita et al. ........... 174/261

FOREIGN PATENT DOCUMENTS

| JP | 05-120928 | 5/1993 |
| JP | 2001-060746 | 3/2001 |
| JP | 2003-031032 | 1/2003 |
| JP | 2003-031044 | 1/2003 |

* cited by examiner

*Primary Examiner*—John B. Vigushin
(74) *Attorney, Agent, or Firm*—Morrison & Foerster LLP

(57) ABSTRACT

At least one of a feedback path and a feed path is divided into two paths, and the divided feedback path and the feed path for feeding a signal form a twisted pattern to suppress radiation noise of a high frequency by a twisted pair effect. The other divided feedback path decreases a resistance value of a direct current component and decreases a whole direct current resistance to feed a sufficient current to the path.

8 Claims, 7 Drawing Sheets

CIRCUIT BOARD TRANSMITTING HIGH FREQUENCY SIGNAL

This nonprovisional application is based on Japanese Patent Application No. 2003-375965 filed with the Japan Patent Office on Nov. 5, 2003 the entire contents of which are hereby incorporated by reference.

BACKGROUND OF THE INVENTION

1. Field of the Invention

The present invention relates to a circuit board transmitting a high frequency signal. More specifically, the present invention relates to a circuit board used for optical pickup to perform recording/regeneration or regeneration for a magnetic recording medium such as a magneto-optical disc.

2. Description of the Background Art

A laser diode for optical pickup is usually used to read information of DVD (Digital Versatile Disc), MD (Mini Disc) or the like. In the optical pickup for regeneration, a magneto-optical disc is irradiated with a light beam and reflected light thereof is received to regenerate recorded information utilizing a Kerr effect. During regeneration of the recorded information of the magneto-optical disc, if there is optical feedback from a side of the magneto-optical disc to an end surface of the laser diode, modulation may occur and accurate regeneration may not be possible. Therefore, to cancel the effect of optical feedback to the end surface of the laser diode, a technique has been adopted for superposing a high frequency current of several hundred MHz on a drive signal (current) driving the laser diode using a high frequency superposition circuit including a high frequency oscillator.

Since the high frequency current is superposed using the high frequency superposition circuit, however, unnecessary radiation noise of a high frequency component is generated on the periphery.

Various suggestions have been made conventionally to suppress the radiation noise. In Japanese Patent Laying-Open No. 5-120928, for example, a pair of transmission paths consisting of a feed path and a feedback path for transmitting a signal on a circuit board are formed to meander to each other, and one circuit conductor and the other circuit conductor form a region surrounded with the one circuit conductor and the other circuit conductor between two points of intersection with each other when seen from a direction perpendicular to a plane direction of the circuit conductor to obtain a twisted pair effect. A technique for suppressing the unnecessary radiation noise by obtaining the twisted pair effect is adopted. Another technique for obtaining the twisted pair effect is to provide a through hole in an insulation layer of a substrate and twist the transmission paths three-dimensionally via the through hole with alternate transition from one circuit conductor to the other circuit conductor of the insulation layer.

To obtain the twisted pair effect sufficiently, however, a sufficiently large region surrounded with one circuit conductor and the other circuit conductor between two points of intersection of the feed path and the feedback path of the signal must be ensured. In order to form the large region, a lateral width of the meander of at least three times larger than an interconnection width of the feed or feedback path must be ensured.

In the optical pickup for recording, on the other hand, in place of receiving the reflected light to read the recorded information, the magneto-optical disc is irradiated with a strong light beam to increase a temperature on the disc to record a signal. Therefore, the high frequency current is not superposed as cancellation of the effect of optical feedback as for the regeneration is not necessary. During the recording, as irradiation with a light beam stronger than that for regeneration is needed, a current of several times larger than that for regeneration must be fed to the laser diode. Therefore, a certain degree of the interconnection width is needed to allow flowing of the current of several times larger than that for regeneration. When the interconnection width is made wider, however, tight meandering becomes difficult, and thus it becomes difficult to generate a sufficient twisted pair effect.

In addition, when the twisted pair effect is obtained using the through hole, though the twisted pair effect can be expected according to a number of the through holes, a direct current resistance component increases when the number of the through holes is increased, which inhibits ensuring of a current for recording.

SUMMARY OF THE INVENTION

The present invention is made to solve problems as described above. An object of the present invention is to provide a circuit board which enables suppression of radiation noise during regeneration and ensuring of a sufficient drive current for recording.

A circuit board according to the present invention is a circuit board for suppressing radiation noise generated based on a drive signal flowing through a path, and includes a feed path for transmitting a drive signal of a high frequency component and a direct current component to an internal circuit, and a feedback path for transmitting a feedback signal fed back from the internal circuit receiving the drive signal. One of the feed path and the feedback path includes a first path and a second path. The first path has a resistance value of the direct current component lower than that of the second path and an impedance of the high frequency component higher than that of the second path. The second path and the other of the feed path and the feedback path form a twisted pattern with arrangement relations to each other.

With this construction, as a twisted pattern is formed using the second path and the other of the feed path and the feedback path, the radiation noise can be suppressed by a twisted pair effect. In addition, since the first path has a resistance value of the direct current component lower than that of the second path, a whole direct current resistance can be decreased and a sufficient current can be fed to the path.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
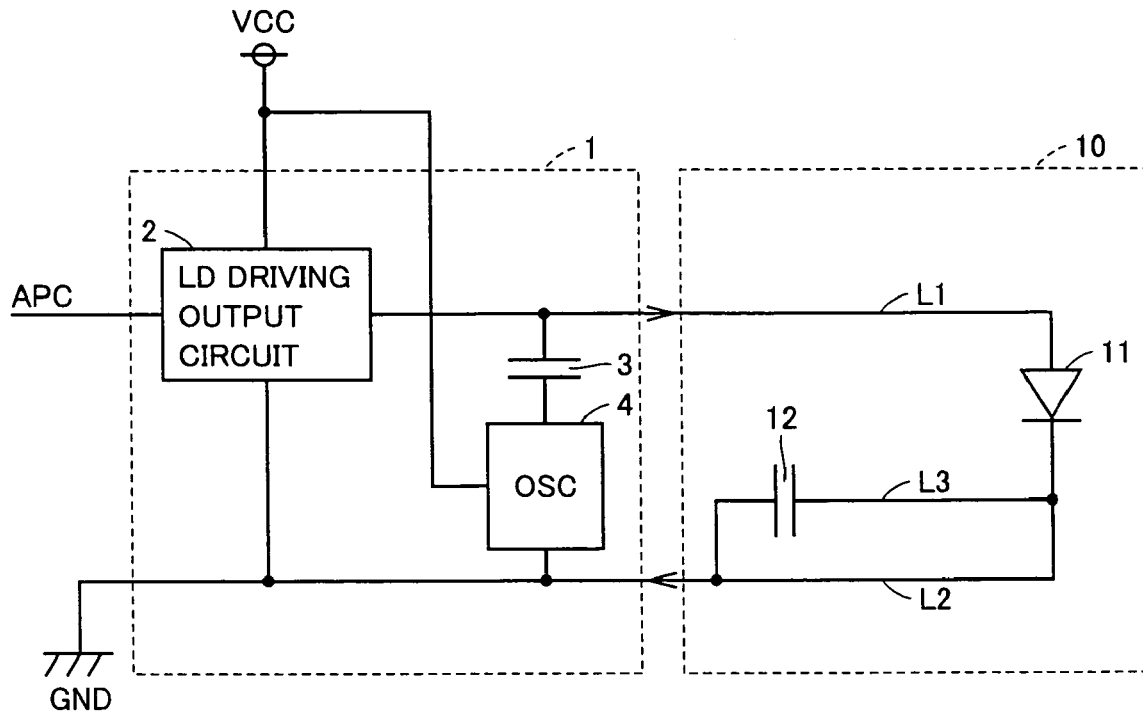
FIG. 1 is a conceptual diagram of a laser diode driving circuit according to a first embodiment of the present invention.

Embodiments of the present invention will now be described in detail referring to the drawings. The same or corresponding portions in the drawings are indicated with the same characters, and descriptions thereof will not be repeated.

Referring to FIG. 1, a laser diode driving circuit according to a first embodiment of the present invention includes a drive unit 1 for driving a laser diode and a diode unit 10 having the laser diode.

Drive unit 1 includes an LD driving output circuit 2, an oscillator 4 (hereafter also referred to as OSC) and a capacitor 3.

Diode unit 10 includes a laser diode 11 (hereafter also simply referred to as a diode) and a capacitor 12.

LD driving output circuit 2 uses a power supply voltage VCC and a ground voltage GND as an operation voltage, and receives an input of a laser power control signal APC (hereafter also simply referred to as control signal APC) to output an LD drive signal (current) to diode unit 10. An LD drive signal (current) for regeneration and recording is adjusted based on the input of control signal APC.

OSC 4 uses power supply voltage VCC and ground voltage GND as an operation voltage and superposes a high frequency signal (current) on the LD drive signal via capacitor 12 as necessary, more specifically, during regeneration.

Diode unit 10 includes a transmission line L1 to be a feed path for transmitting the LD drive signal from drive unit 1 to diode 11, transmission lines L2, L3 to be feedback paths for transmitting a feedback signal from diode 11, and capacitor 12. Transmission line L3 has one end side electrically coupled to diode 11, and is electrically coupled to ground voltage GND via capacitor 12 provided on the other end side.

Figure 2:
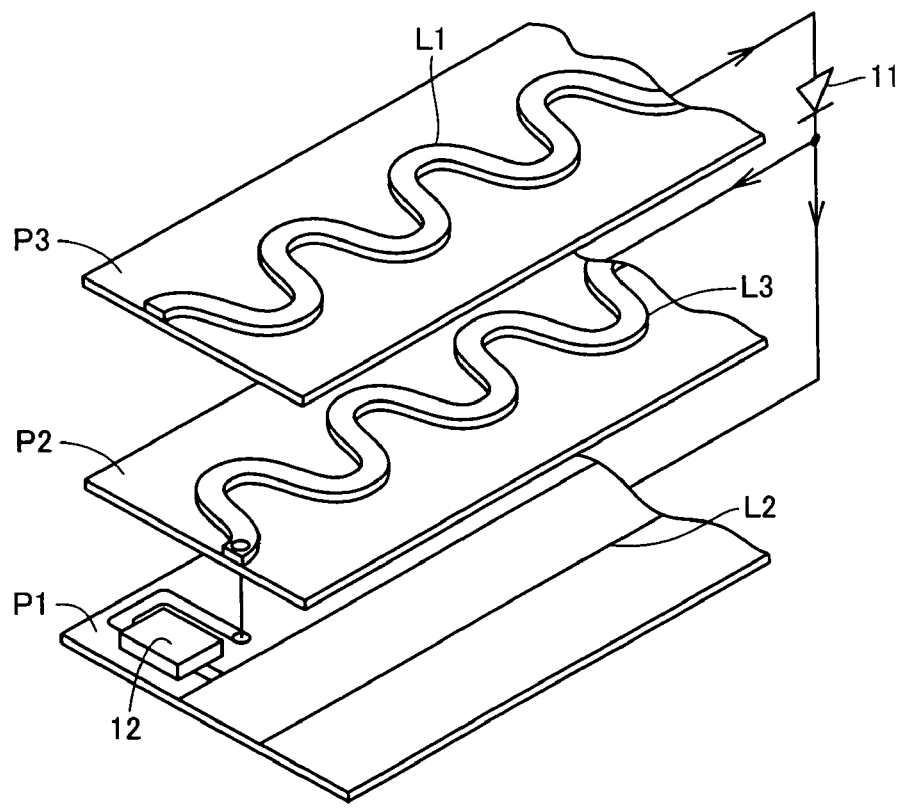
FIG. 2 is a conceptual diagram for describing an interconnection structure of a diode unit according to the first embodiment of the present invention.

Referring to FIG. 2 which shows an interconnection structure of diode unit 10 according to the first embodiment of the present invention, interconnection layers having a three-layered structure in diode unit 10 are shown, and the interconnection layers are insulated from each other by insulation layers which are not shown.

Transmission line L2 is formed in an interconnection layer P1 which is a first layer (a lower layer). Transmission line L3 is formed in an interconnection layer P2 which is a second layer (a middle layer). Transmission line L1 is formed in an interconnection layer P3 which is a third layer (an upper layer).

Transmission line L1 is formed in a wave-like meandering manner in upper interconnection layer P3 and is electrically coupled to diode 11. Transmission lines L2, L3 of lower interconnection layer P1 and middle interconnection layer P2, respectively, are electrically coupled to an output node of diode 11. Transmission line L3 is formed in a wave-like meandering manner in middle interconnection layer P2. Transmission line L3 is also electrically coupled to capacitor 12 provided on the lower layer via a contact hole. Transmission line L2 has a wide interconnection width, and is formed along a transmitting direction without meandering. Therefore, in a construction according to the present application, the transmission line as to the feedback path of the drive signal of laser diode 11 is branched using two interconnection layers. More specifically, transmission line L2 forms a first feedback path, and transmission line L3 and capacitor 12 form a second feedback path.

Figure 3:
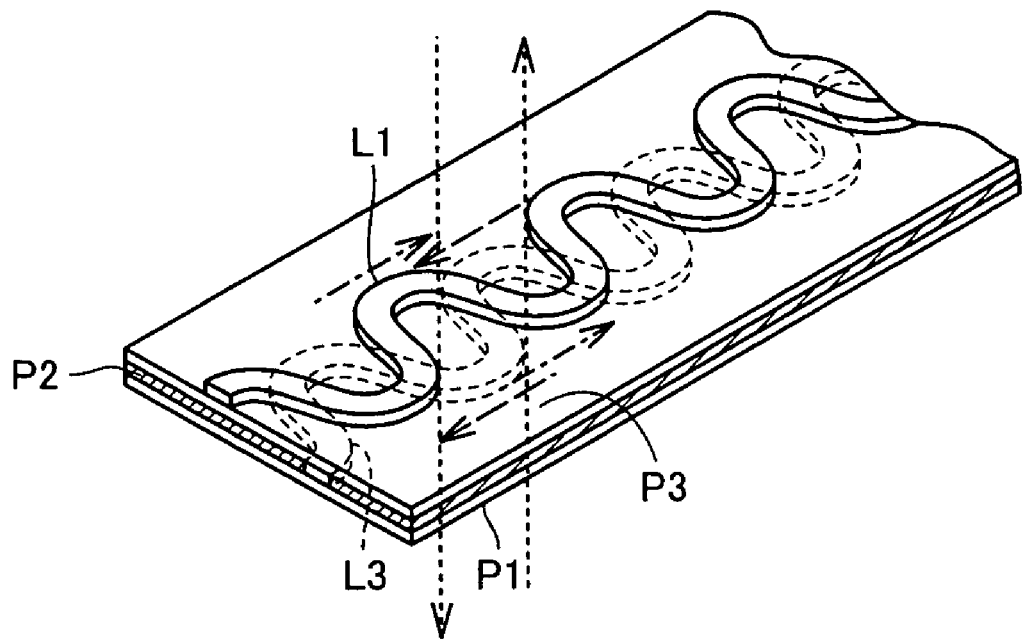
FIG. 3 is a conceptual diagram seen from a direction perpendicular to a plane direction of interconnection layers described in FIG. 2.

Referring to FIG. 3, interconnection layers P1–P3 are shown. As shown in FIG. 3, meandering transmission line L1 formed in interconnection layer P3 and meandering transmission line L3 formed in interconnection layer P2 form a twisted pattern forming a surrounded region between two points of intersection with each other when seen from a direction perpendicular to a plane direction. With the twisted pattern forming the prescribed region, a twisted pair effect can be generated. When directions of magnetic lines of force are considered, for example, the magnetic lines of force generated in the adjacent prescribed regions have directions opposite to each other and are cancelled. Similarly, radiation noise can be cancelled and suppressed by the twisted pattern.

Figure 4:
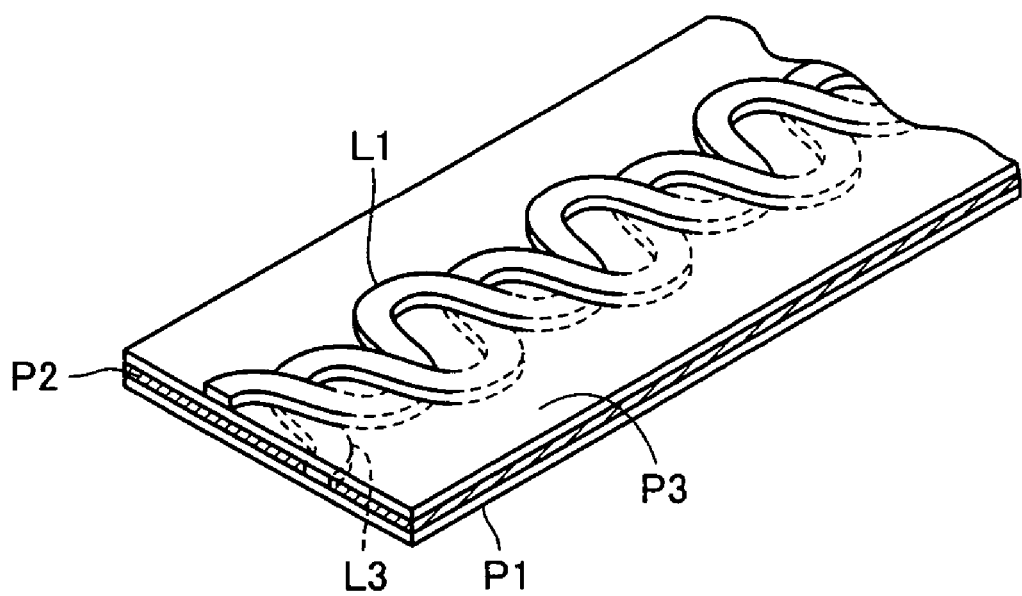
FIG. 4 is a conceptual diagram for describing a technique for generating a twisted pair effect with a contact hole.

FIG. 4 is a conceptual diagram for describing a technique for generating the twisted pair effect with a contact hole.

In this situation, transmission lines L1 and L3 are formed so as to meander and alternately be upper side and lower side in middle interconnection layer P2 and upper interconnection layer P3 with a contact hole (not shown). With this construction, the twisted pattern can be formed with the transmission lines three-dimensionally, and the twisted pair effect can be generated.

Referring back to FIG. 2, in this construction, transmission line L3 is capacitively coupled to capacitor 12. Therefore, an impedance of a high frequency component is decreased. As a result, the high frequency component is more easily guided to transmission line L3, and the effect of radiation noise can further be suppressed with the twisted pair effect.

Furthermore, in this construction, transmission line L2 to be the other feedback path is provided. More specifically, while meandering transmission line L3 is provided as described above, the other transmission line L2 having a wide conductor width is provided to suppress an increase in a direct current resistance component as much as possible. In addition, as transmission line L3 is capacitively coupled to capacitor 12 as described above, a direct current component flows through transmission line L2. Transmission line L2 has an interconnection width larger than that of transmission line L3, and is formed without providing a through hole or meandering in the interconnection layer so as to suppress a direct current resistance component as much as possible. Therefore, with this construction, a whole direct current resistance can be decreased by suppressing the direct current resistance of transmission line L2 to be a feedback path, which enables ensuring of a sufficient current to flow through diode 11 during recording.

With this construction, unnecessary radiation noise generated during regeneration can be suppressed with the twisted pair effect generated by the twisted pattern of transmission lines L1 and L3, and a sufficient current to flow during recording can be ensured by providing transmission line L2 having a small direct current resistance component.

It is to be noted that, though an arrangement of capacitor 12 electrically coupled to a distal end portion of transmission line L3 is shown in the construction of FIG. 2, it is not limited to the distal end portion and an arrangement on an arbitrary position such as a proximal end portion or near a center portion is also possible. In addition, a number of the capacitor is not limited to one, and further decrease in the impedance of the high frequency component by arranging a plurality of capacitors is also possible.

Modified Example 1 of First Embodiment

Figure 5:
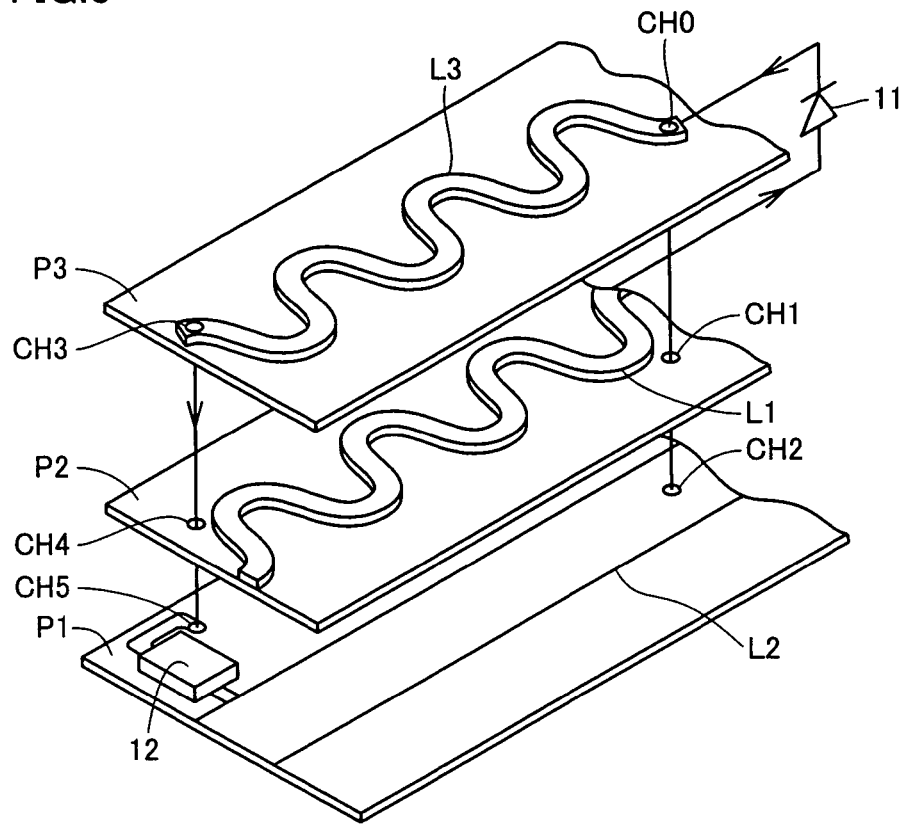
FIG. 5 is a conceptual diagram for describing an interconnection structure of a diode unit according to a modified example 1 of the first embodiment of the present invention.

Referring to FIG. 5, in an interconnection structure of diode unit 10 according to a modified example 1 of the first embodiment of the present invention, the transmission lines formed in interconnection layers P2 and P3 are interchanged as compared with the interconnection structure shown in FIG. 2. More specifically, transmission line L3 which was formed in middle interconnection layer P2 is now formed in upper interconnection layer P3, and transmission line L1 which was formed in upper interconnection layer P3 is now formed in middle interconnection layer P2. In this construction, the output node of the diode is electrically coupled to transmission line L2 formed in lower interconnection layer P1 via contact holes CH0, CH1 and CH2. In addition, transmission line L3 is electrically coupled to capacitor 12 via contact holes CH3, CH4 and CH5.

With this interconnection structure, a circuit equivalent to diode unit 10 described in the first embodiment can be formed. That is, an effect similar to that in the first embodiment can be obtained.

Though the construction is described in modified example 1 in which interconnection layers to form transmission lines L1 and L3 are interchangeable using contact holes CH, it is also possible to form transmission lines L1 and L3 using adjacent interconnection layers P1 and P2. That is, various combinations for forming transmission lines L1 and L3 in adjacent interconnection layers can be applied using contact holes CH, which enhances a degree of flexibility in designing.

Modified Example 2 of First Embodiment

In each of the first embodiment and modified example 1, the construction is described in which the feedback path is divided into two paths, more specifically, into the transmission line easily passing the direct current component and the transmission line easily passing the high frequency component. In a modified example 2 of the first embodiment, a construction will be described in which the feed path is divided into two paths.

Figure 6:
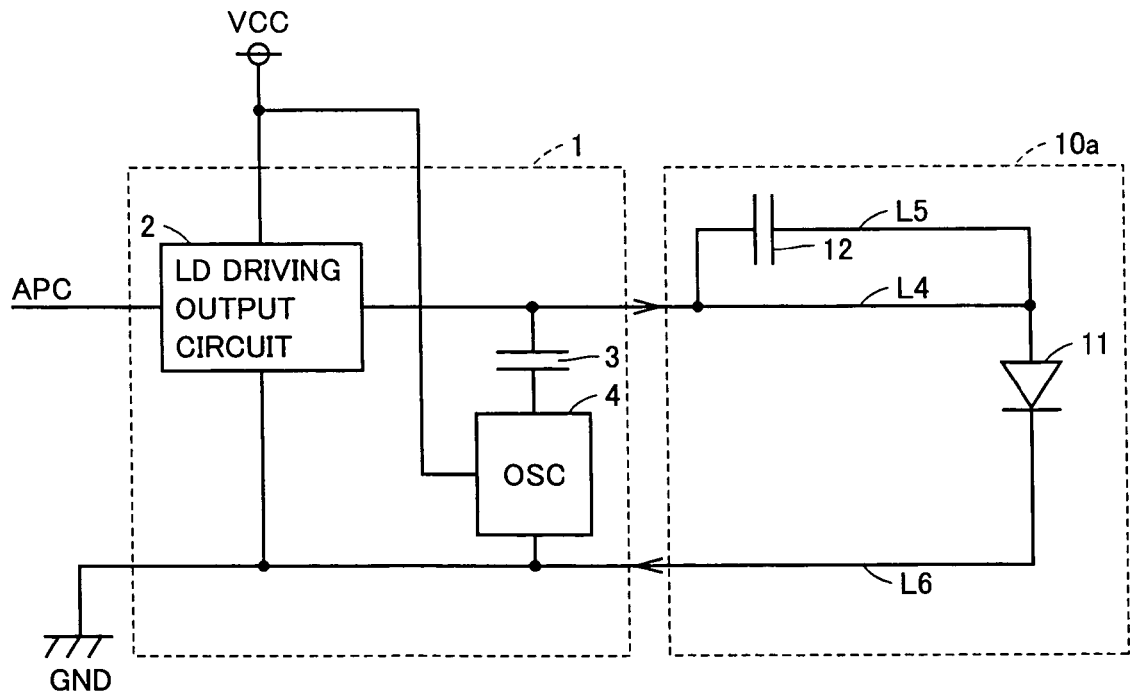
FIG. 6 is a conceptual diagram of a laser diode driving circuit according to a modified example 2 of the first embodiment of the present invention.

Referring to FIG. 6, as compared with the laser diode driving circuit according to the first embodiment of the present invention as shown in FIG. 1, a laser diode driving circuit according to modified example 2 of the first embodiment of the present invention is different in that, diode unit 10 is replaced with a diode unit 10a. As the other points are similar, detailed descriptions thereof will not be repeated.

Diode unit 10a includes transmission lines L4, L5 to be feed paths for transmitting the LD drive signal from drive unit 1 to diode 11, a transmission line L6 to be a feedback path for transmitting the feedback signal from diode 11, capacitor 12, and diode 11. Transmission line L5 has one end side electrically coupled to capacitor 12 and the other end side electrically coupled to an input node of diode 11.

Figure 7:
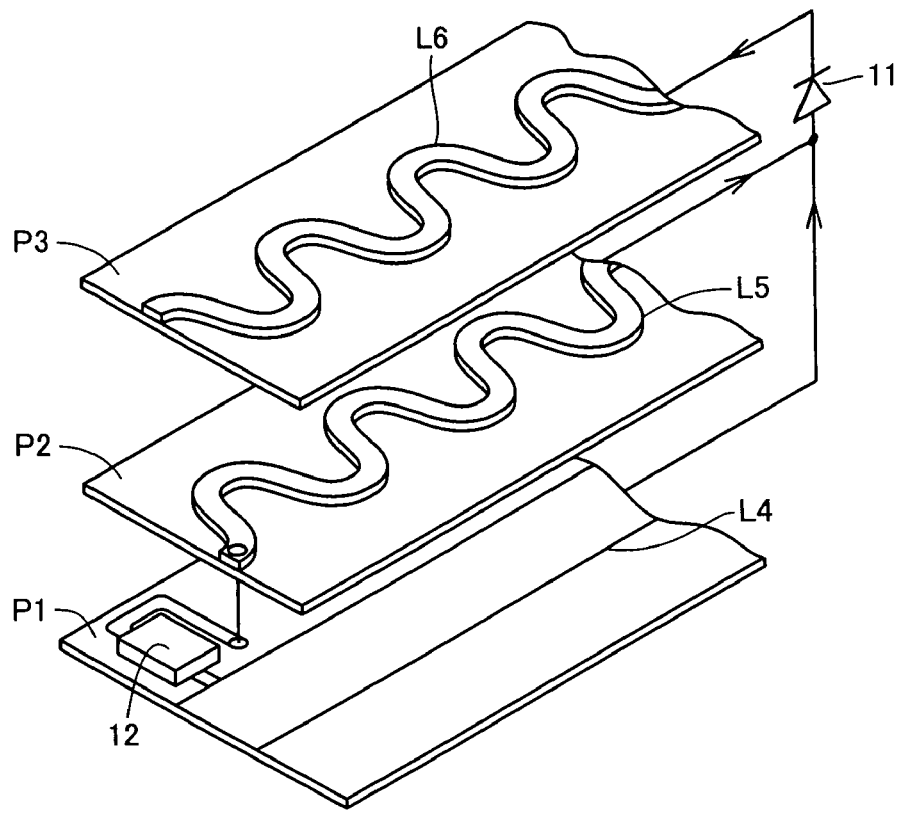
FIG. 7 is a conceptual diagram for describing an interconnection structure of a diode unit according to modified example 2 of the first embodiment of the present invention.

Referring to FIG. 7 which shows an interconnection structure of diode unit 10a according to modified example 2 of the first embodiment of the present invention, interconnection layers having a three-layered structure are shown, and the interconnection layers are insulated from each other by insulation layers which are not shown.

Transmission line L4 is formed in interconnection layer P1 which is the first layer (the lower layer). Transmission line L5 is formed in interconnection layer P2 which is the second layer (the middle layer). Transmission line L6 is formed in interconnection layer P3 which is the third layer (the upper layer).

Transmission line L6 electrically coupled to the output node of diode 11 is formed in a wave-like meandering manner in upper interconnection layer P3. Lower interconnection layer P1 and middle interconnection layer P2 are electrically coupled to the input node of diode 11. Transmission line L5 is formed in a wave-like meandering manner in middle interconnection layer P2. Transmission line L5 is also electrically coupled to capacitor 12 provided on the lower layer via a contact hole. Transmission line L4 has a wide interconnection width, and is formed along a transmitting direction without meandering. Therefore, in the construction according to the present application, the transmission line as to the feed path of the drive signal of laser diode 11 is branched using two interconnection layers. More specifically, transmission line L4 forms a first feed path, and transmission line L5 and capacitor 12 form a second feed path. In this construction, the radiation noise can be cancelled and suppressed by the twisted pattern formed with transmission lines L5 and L6. In addition, as transmission line L5 is capacitively coupled to capacitor 12, the impedance of the high frequency component is decreased. As a result, the high frequency component is more easily guided, and the effect of radiation noise can further be suppressed with the twisted pair effect.

Furthermore, in this construction, transmission line L4 to be the other feed path is provided. More specifically, while meandering transmission line L5 is provided as described above, the other transmission line L4 having a wide conductor width is provided to suppress an increase in the direct current resistance component as much as possible. In addition, as transmission line L5 is capacitively coupled to capacitor 12 as described above, the direct current component flows through transmission line L4. Transmission line L4 has an interconnection width larger than that of transmission line L5, and is formed without providing a through hole or meandering in the interconnection layer so as to suppress a direct current resistance component as much as possible. Therefore, with this construction, a whole direct current resistance can be decreased by suppressing the direct current resistance of transmission line L4 to be a feed path, which enables ensuring of a sufficient current to flow through diode 11 during recording.

Second Embodiment

Figure 8:
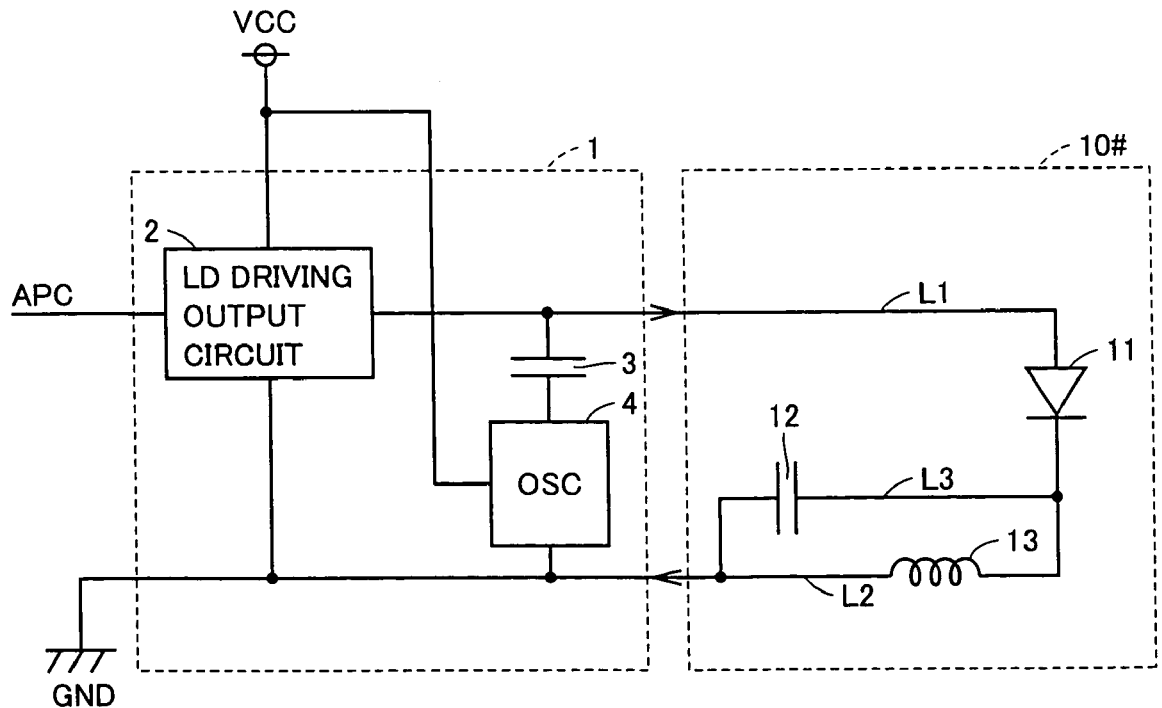
FIG. 8 is a conceptual diagram of a laser diode driving circuit according to a second embodiment of the present invention.

Referring to FIG. 8, as compared with the laser diode driving circuit according to the first embodiment of the present invention as shown in FIG. 1, a laser diode driving circuit according to a second embodiment of the present invention is different in that, diode unit 10 is replaced with a diode unit 10#. As the other points are similar, detailed descriptions thereof will not be repeated.

As compared with diode unit 10, diode unit 10# is different in that a coil 13 is further provided therein. Coil 13 has one end side electrically coupled to the output node of diode 11 and the other end side electrically coupled to transmission line L2.

By electrically coupling coil 13 to transmission line L2 as in this construction, the impedance of the high frequency component of transmission line L2 is increased. Therefore, a flow of the high frequency component through transmission line L2 is inhibited and the high frequency component mainly flows through transmission line L3. As a result, the radiation noise can further be suppressed with the twisted pair effect based on the twisted pattern formed with transmission lines L1 and L3.

Figure 9:
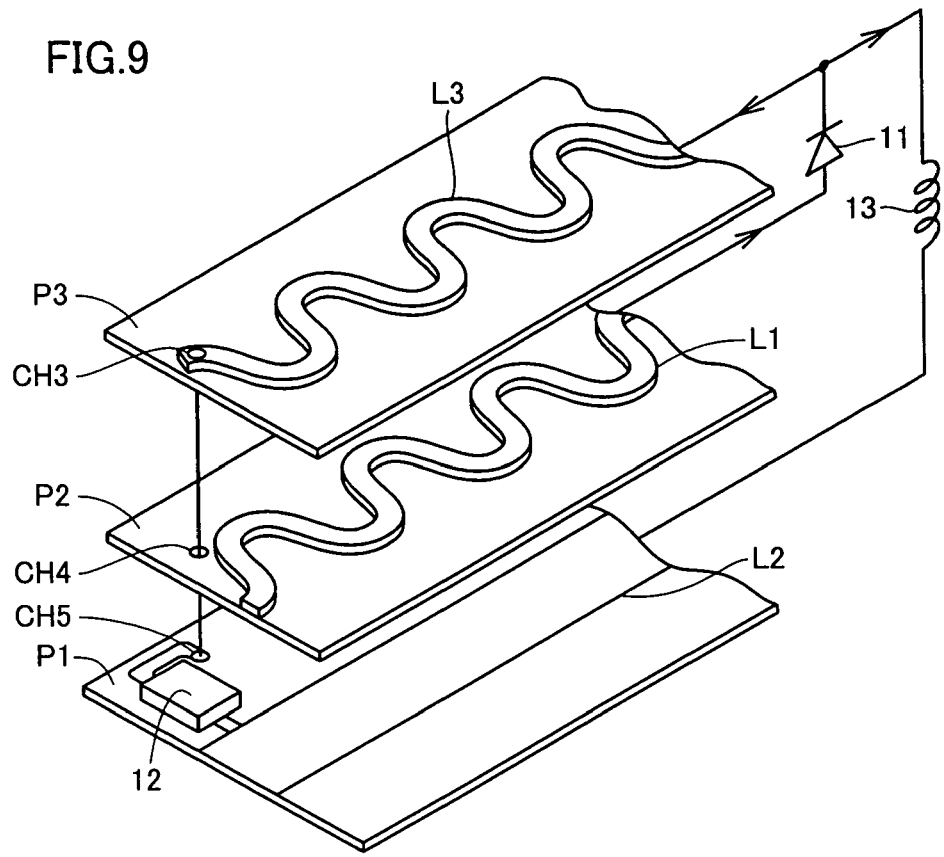
FIG. 9 is a conceptual diagram for describing an interconnection structure of a diode unit according to the second embodiment of the present invention.

Referring to FIG. 9, as compared with the interconnection structure of diode unit 10 shown in FIG. 5, an interconnection structure of diode unit 10# according to the second embodiment of the present invention is different in that, coil 13 is further provided therein. As the other points are similar, detailed descriptions thereof will not be repeated. Though a construction having transmission lines L2 and L3 electrically coupled to each other using contact holes CH0–CH2 is not shown here, it is also possible to electrically couple transmission line L3 to transmission line L2 via contact holes CH0–CH2 and coil 13.

It is to be noted that, though an arrangement of coil 13 electrically coupled to a proximal end portion of transmission line L2 is shown in the construction of FIG. 9, it is not limited to the proximal end portion and an arrangement on an arbitrary position such as a distal end portion or near a center portion is also possible. In addition, a number of the coil is not limited to one, and further increase in the impedance of the high frequency component by arranging a plurality of coils is also possible.

Modified Example 1 of Second Embodiment

In the second embodiment, the construction is described in which coil 13 is newly added and the feedback path is divided into two paths, more specifically, into the transmission line easily passing the direct current component and the transmission line easily passing the high frequency component. In a modified example 1 of the second embodiment, a construction will be described in which coil 13 is newly added and the feed path is divided into two paths.

Figure 10:
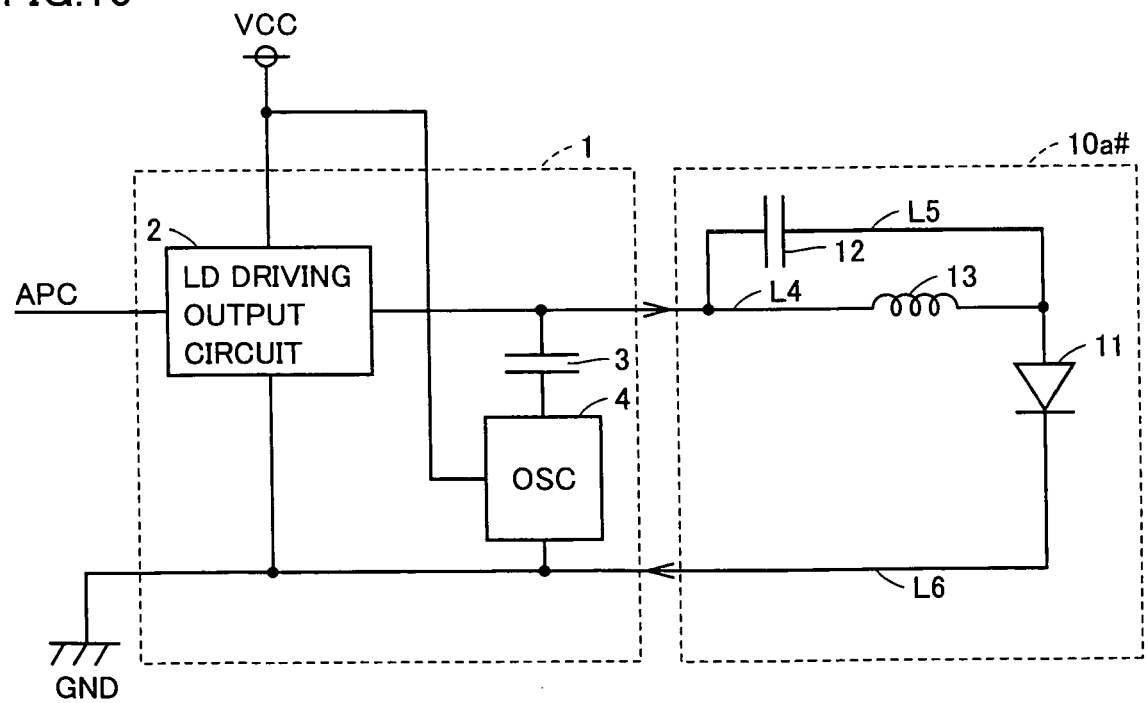
FIG. 10 is a conceptual diagram of a laser diode driving circuit according to a modified example 1 of the second embodiment of the present invention.

Referring to FIG. 10, as compared with the laser diode driving circuit shown in FIG. 6, a laser diode driving circuit according to modified example 1 of the second embodiment of the present invention is different in that, diode unit 10a is replaced with a diode unit 10a#. As compared with diode unit 10, diode unit 10a# is different in that coil 13 is further provided therein. Coil 13 has one end side electrically coupled to transmission line L4 and the other end side electrically coupled to the input node of diode 11. As the other portions are similar, detailed descriptions thereof will not be repeated.

Figure 11:
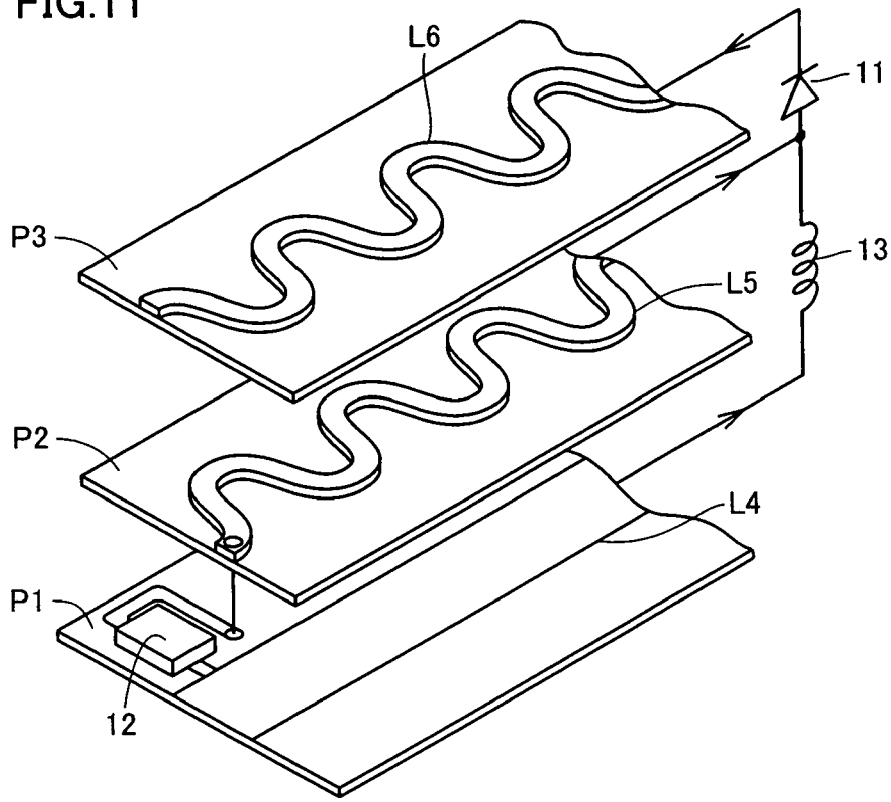
FIG. 11 is a conceptual diagram for describing an interconnection structure of a diode unit according to modified example 1 of the second embodiment of the present invention.

Referring to FIG. 11, as compared with the interconnection structure of diode unit 10a shown in FIG. 7, an interconnection structure of diode unit 10a# according to modified example 1 of the second embodiment of the present invention is different in that, coil 13 is provided between transmission line L4 and diode 11. As the other portions of the construction are similar, detailed descriptions thereof will not be repeated.

With this construction, the impedance of transmission line L4 can be increased more than in modified example 2 of the first embodiment. Therefore, a flow of the high frequency component through transmission line L4 is inhibited and the high frequency component mainly flows through transmission line L5. As a result, the radiation noise can further be suppressed with the twisted pair effect based on the twisted pattern formed with transmission lines L5 and L6.

Modified Example 2 of Second Embodiment

In each of the above-described embodiments, the construction is described in which the feed path or the feedback path is divided into two paths. In a modified example 2 of the second embodiment of the present invention, a construction will be described in which the above-described constructions are combined and both of the feed path and the feedback path are divided into respective two paths.

Figure 12:
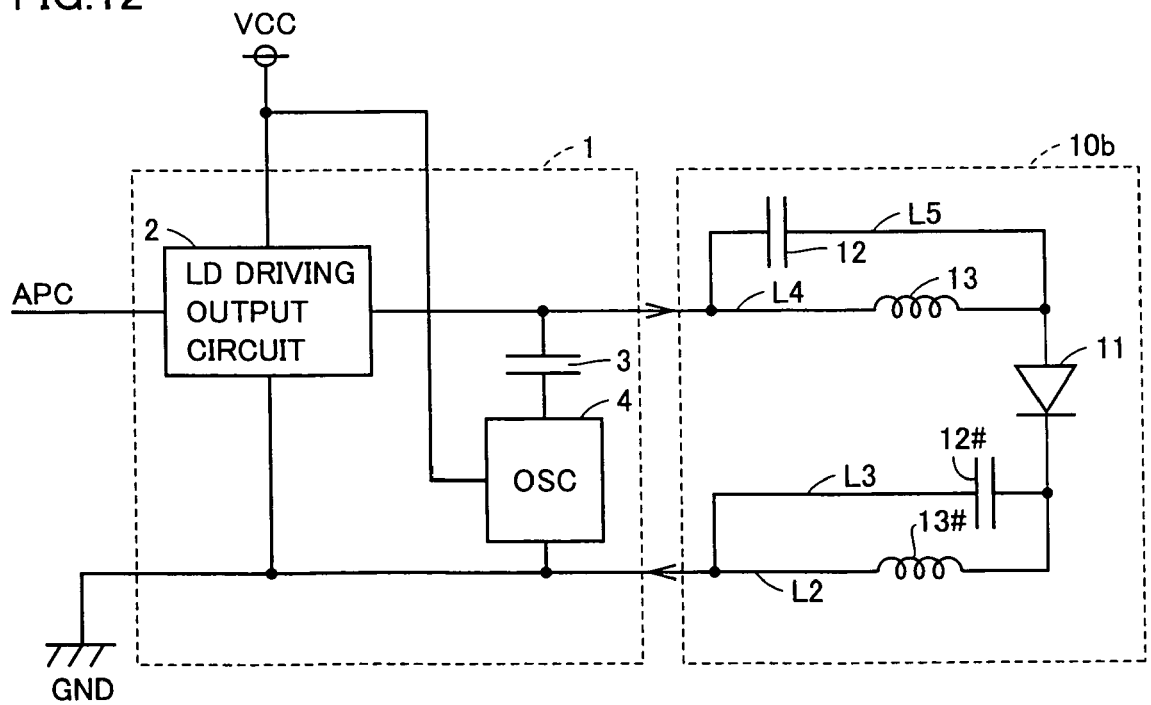
FIG. 12 is a conceptual diagram of a laser diode driving circuit according to a modified example 2 of the second embodiment of the present invention.

Referring to FIG. 12, as compared with the laser diode driving circuit according to modified example 1 of the second embodiment of the present invention as shown in FIG. 10, a laser diode driving circuit according to modified example 2 of the second embodiment of the present invention is different in that, diode unit 10a# is replaced with a diode unit 10b. As the other points are similar, detailed descriptions thereof will not be repeated.

More specifically, diode unit 10b is different in that, in place of transmission line L6, transmission lines L2, L3, a capacitor 12#, and a coil 13# are arranged therein. As the other points are similar to those in diode unit 10a#, detailed descriptions thereof will not be repeated. In diode unit 10b, transmission line L2 is electrically coupled to the output node of diode 11 via coil 13#. In addition, transmission line L3 is electrically coupled to the output node of diode 11 via capacitor 12#.

Figure 13:
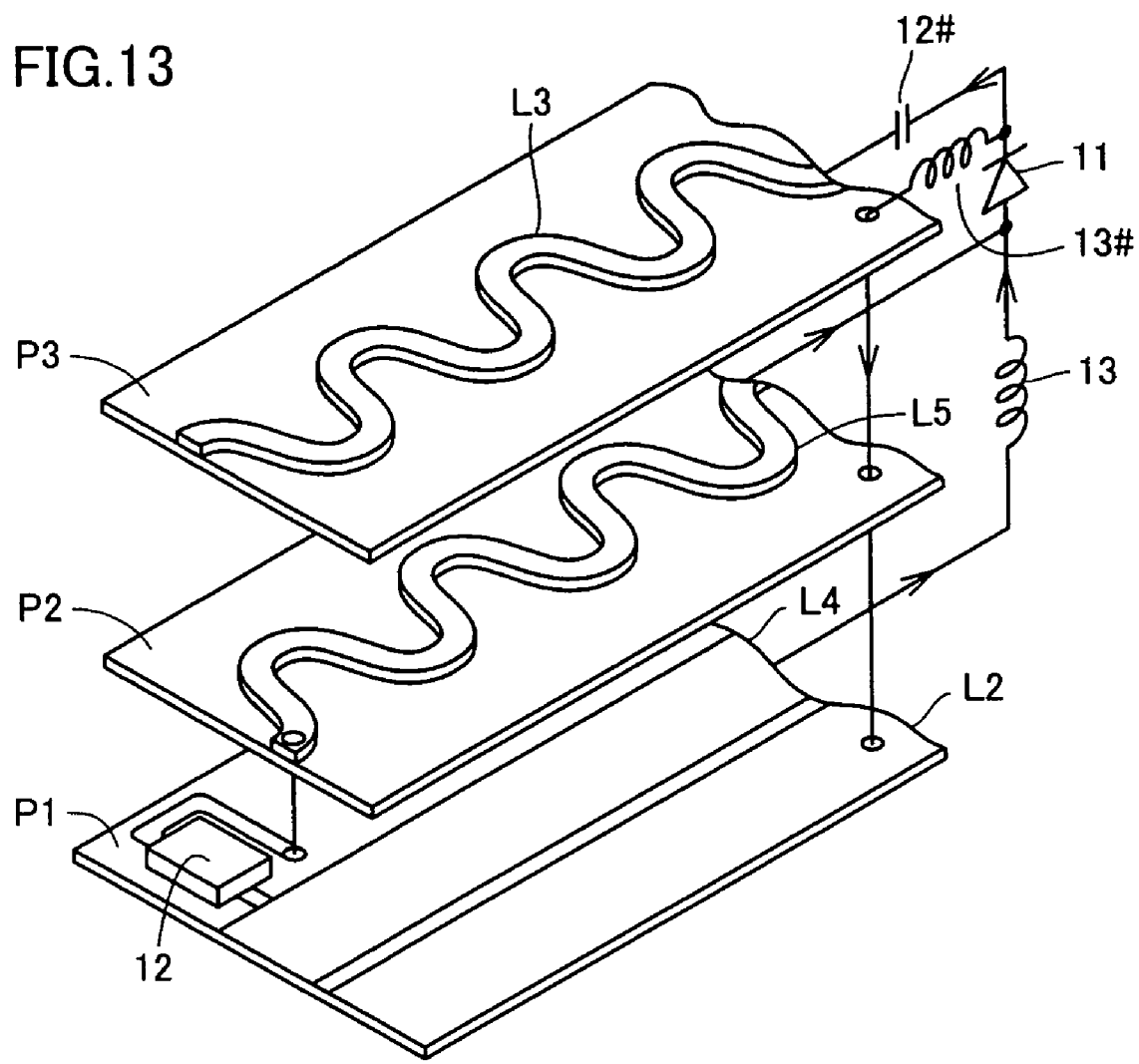
FIG. 13 is a conceptual diagram for describing an interconnection structure of a diode unit according to modified example 2 of the second embodiment of the present invention.

Referring to FIG. 13, as compared with the interconnection structure of diode unit 10a# shown in FIG. 11, an interconnection structure of diode unit 10b according to modified example 2 of the second embodiment of the present invention is different in that, capacitor 12#, coil 13# and transmission lines L2 and L3 are newly provided therein.

More specifically, transmission line L2 is formed together with transmission line L4 in interconnection layer P1 which is the first layer (the lower layer). In addition, transmission line L5 is formed in interconnection layer P2 which is the second layer (the middle layer). Transmission line L3 is formed in interconnection layer P3 which is the third layer (the upper layer). Coil 13# is arranged between the output node of diode 11 and transmission line L2. Coil 13# is electrically coupled to the output node of diode 11 in parallel with capacitor 12#, and is electrically coupled to transmission line L2 in the first layer via the contact hole. Transmission line L3 is electrically coupled to the output node of diode 11 via capacitor 12#.

With this construction in which both of the feed path and the feedback path are divided into respective two paths, unnecessary radiation noise generated during regeneration can be suppressed more than with the construction in each of the aforementioned embodiments with the twisted pair effect generated by the twisted pattern of transmission lines L3 and L5, and concurrently, a sufficient current to flow during recording can be ensured by providing transmission lines L2, L4 each having a small direct current resistance component.

It is to be noted that, though the construction described above representatively uses the circuit board of the laser diode driving circuit to decrease the radiation noise of high frequency and suppress the direct current resistance component to enable feeding of a sufficient current, it is not for limitation and the present invention can be applied to other circuit boards.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit board for suppressing radiation noise generated based on a drive signal flowing through a path, comprising:
    a feed path for transmitting the drive signal of a high frequency component and a direct current component to an internal circuit; and
    a feedback path for transmitting a feedback signal fed back from said internal circuit receiving said drive signal; wherein
    one of said feed path and said feedback path includes a first path and a second path,
    said first path has a resistance value of the direct current component lower than that of said second path and an impedance of the high frequency component higher than that of said second path, and
    said second path and the other of said feed path and said feedback path form a twisted pattern with arrangement relations to each other.

2. The circuit board according to claim 1, wherein
said second path and the other of said feed path and said feedback path are insulated and are formed in a meandering manner so as to intersect with each other when seen from a prescribed direction.

3. The circuit board according to claim 2, wherein
said second path and the other of said feed path and said feedback path are respectively formed in one and the other of two interconnection layers adjacent to each other with an insulation layer interposed therebetween.

4. The circuit board according to claim 2, wherein
said second path and the other of said feed path and said feedback path are alternately formed using a contact hole and using two interconnection layers adjacent to each other with an insulation layer interposed therebetween.

5. The circuit board according to claim 1, wherein
said second path includes a capacitor.

6. The circuit board according to claim 1, wherein
said first path includes a coil.

7. The circuit board according to claim 1, wherein
said first path has a path width larger than a path width of said second path, and does not meander.

8. The circuit board according to claim 1, wherein
the other of said feed path and said feedback path includes a third path and a fourth path,
said third path has a resistance value of the direct current component lower than that of said fourth path and an impedance of the high frequency component higher than that of said fourth path, and
said first path and said fourth path form a twisted pattern with arrangement relations to each other.

* * * * *